United States Patent [19]

Ikeda

[11] Patent Number: 4,918,681
[45] Date of Patent: Apr. 17, 1990

[54] DATA REPRODUCING APPARATUS USING IDLING CURRENT

[75] Inventor: Hidetoshi Ikeda, Yokohama, Japan

[73] Assignee: Kabushiki Kaisha Toshiba, Kawasaki, Japan

[21] Appl. No.: 137,572

[22] Filed: Dec. 24, 1987

[30] Foreign Application Priority Data

Dec. 25, 1986 [JP] Japan .................. 51-311515

[51] Int. Cl.$^4$ ................................ G11B 7/00
[52] U.S. Cl. .................. 369/116; 369/122; 372/29; 372/31
[58] Field of Search .......... 369/116, 121, 122; 250/205; 372/38, 29, 31

[56] References Cited

U.S. PATENT DOCUMENTS

| | | | |
|---|---|---|---|
| 4,509,156 | 4/1985 | Ohara et al. | 369/54 |
| 4,695,994 | 9/1987 | Steebergen et al. | 369/121 X |
| 4,799,224 | 1/1989 | Bottacchi et al. | 372/38 |

FOREIGN PATENT DOCUMENTS

| | | | |
|---|---|---|---|
| 58-151082 | 9/1983 | Japan | 369/121 |
| 60-239929 | 11/1985 | Japan | 369/116 |
| 2025121 | 1/1980 | United Kingdom | 372/29 |

*Primary Examiner*—Aristotelis M. Psitos
*Attorney, Agent, or Firm*—Finnegan, Henderson, Farabow, Garrett and Dunner

[57] ABSTRACT

A data reproducing apparatus is disclosed which permits stabilization of the light output of a light source, thereby to permit reliable reproduction of data. When recording data on an optical disk and also when reproducing the recorded data by illuminating the optical disk by means of a laser beam from a semiconductor laser, an idling current is supplied in advance to the semiconductor laser, to such an extent that the semiconductor laser does not emit a laser beam. As a result of the preliminary supply of the idling current, the output of the semiconductor laser is stabilized.

4 Claims, 2 Drawing Sheets

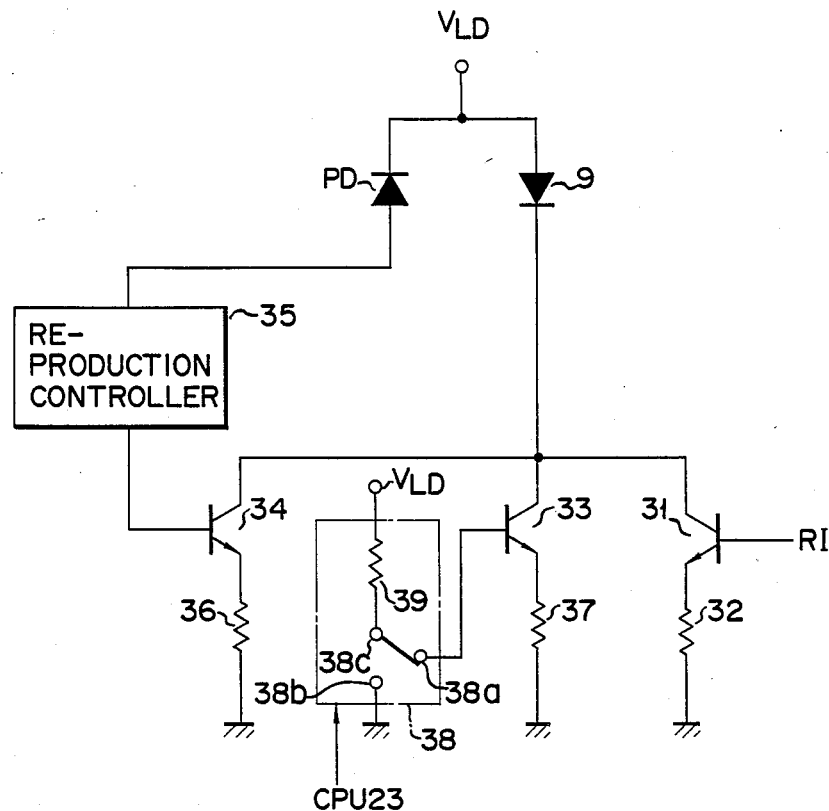
F I G. 2

DATA REPRODUCING APPARATUS USING IDLING CURRENT

BACKGROUND OF THE INVENTION

This invention relates to a data reproducing apparatus for recording data on an optical disk and reproducing the data therefrom.

As is well known in the art, there have been developed various data reproducing apparatus for recording data on the optical disk and reading out data recorded on the optical disk using a laser beam produced from a semiconductor laser.

In various data reproducing apparatus of this type, no current is supplied to a semiconductor laser except for cases when reproducing data recorded on the optical disk or when recording data on the optical disk, i.e., when the semiconductor laser is emitting light to such an extent that focusing on the optical disk and tracking thereon are possible. The semiconductor laser generally provides instable light output in the initial stage of light emission. Therefore, when recording is started by driving the semiconductor laser at the time of the recording on the optical disk, satisfactory recording can not be obtained.

SUMMARY OF THE INVENTION

This invention has an object of providing a data reproducing apparatus, which permits stabilization of the light output of a light source to permit reliable recording and reproduction of data.

The invention seeks to provide a data reproducing apparatus for recording and reproducing data on and out of a recording medium by illuminating the medium with light, which apparatus comprises a light source controlled for light emission when recording data on the recording medium and also when reproducing recorded data out of the recording medium and supply means for supplying the light source an idling current to such an extent that the light source does not emit light.

According to the invention, the light output of the light source is stabilized by supplying to the light source, which is controlled for light emission when recording data on the recording medium and reproducing recorded data from the recording medium, an idling current to such an extent that the light source does not emit light except for cases when recording and reproducing data.

BRIEF DESCRIPTION OF THE DRAWINGS

FIG. 2 is a circuit diagram of the laser control circuit used in the apparatus shown in FIG. 1.

DETAILED DESCRIPTION OF THE PREFERRED EMBODIMENT

Figure 1:
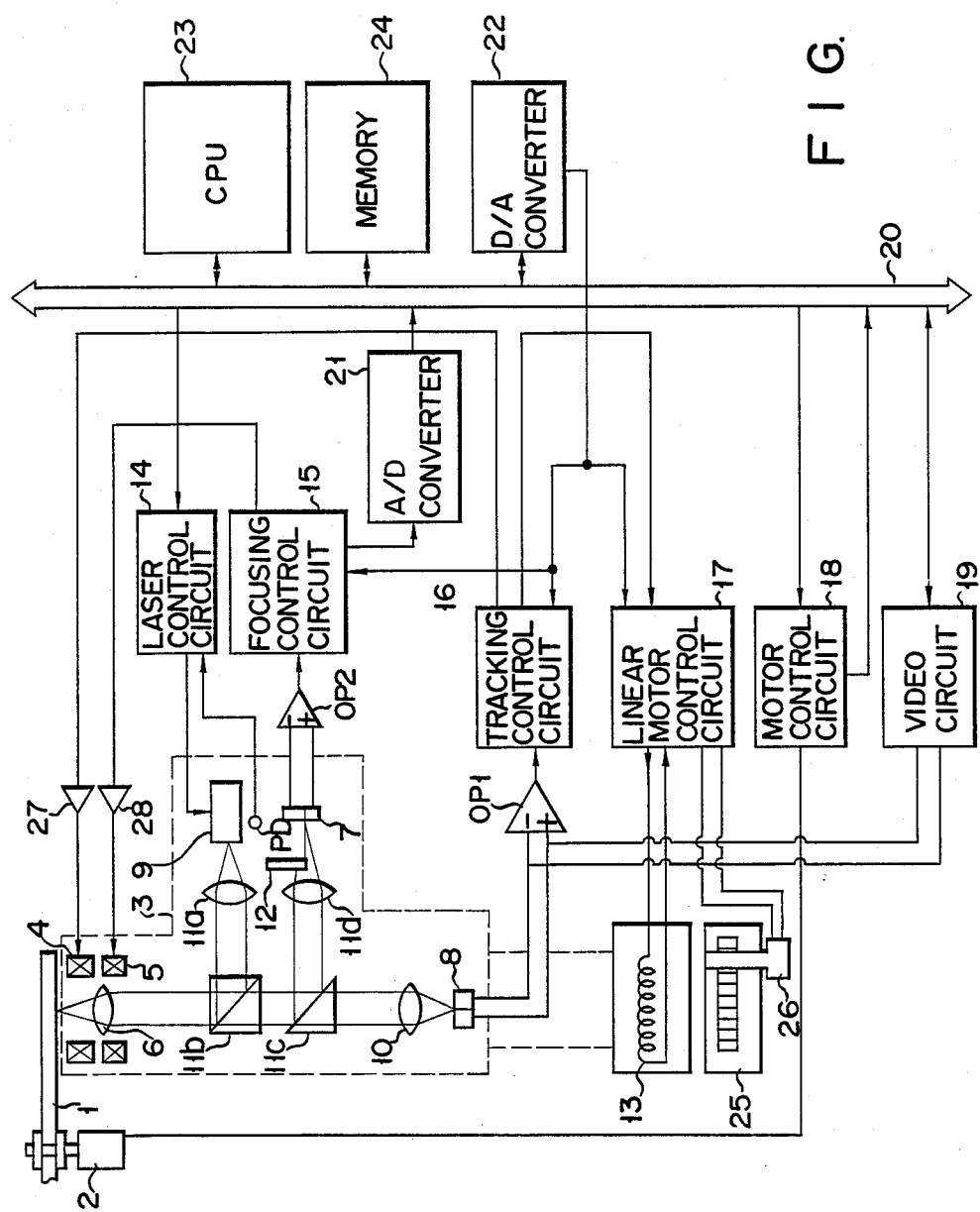
FIG. 1 is a block diagram showing a data reproducing apparatus according to the present invention.

Now, one embodiment of the invention will be described with reference to the drawings.

FIG. 1 shows a data reproducing apparatus. Reference numeral 1 designates an optical disk (recording medium) having spiral or concentric circular grooves (or tracks) formed on the surface. Optical disk 1 is rotated at a constant speed, for instance, by motor 2. Motor 2 is controlled by motor controller 18. The recording of data on optical disk 1 and reproduction of data from therefrom are performed by optical head 3. Optical head 3 is secured to drive coil 13 which constitutes a movable part of a linear motor. Drive coil 13 is connected to linear motor controller 17. Linear motor position detector 26 is connected to linear motor controller 17. Linear motor position detector 26 provides a position signal by detecting optical scale 25 provided on optical head 3. A stationary section of the linear motor is provided with a permanent magnet (not shown). When drive coil 13 is excited by linear motor controller, optical head 3 is moved in the radial direction of optical disk 1.

Optical head 3 has objective lens 6 which is held in position by a leaf spring (not shown). Objective lens 6 can be moved in the focusing direction (i.e., direction of the optical axis of lens) by drive coil 5 and can be moved in the tracking direction (i.e., direction perpendicular to the optical axis of lens) by drive coil 4. Further, laser beam generated from semiconductor laser 9 driven by laser controller 14 is coupled through collimator lens 11a, half prism 11b and objective lens 6 to illuminate optical disk 1. The beam reflected by optical disk 1 is led through objective lens 6 and half prism 11b to half prism 11c. One of two split beams from half prism 11c is led through condenser lens 10 to a pair of tracking position sensors 8 The other split beam from half prism 11c is led through condenser lens 11d and knife edge 12 to a pair of focus position sensors 7.

The output signal of tracking position sensor 8 is supplied through differential amplifier OP1 to tracking controller 16. A tracking difference signal (differential signal) provided from tracking controller 16 is supplied to linear motor controller 17 and is also supplied through amplifier 27 to drive coil 4 for moving optical lens 6 in the tracking direction.

Focus position sensor 7 provides a signal concerning the focal point of the laser beam. This signal is supplied through differential amplifier OP2 to focusing controller 15. The output signal of focusing controller 15 is supplied through amplifier 28 to focusing drive coil 5, so that the laser beam is controlled such that it is just on focus on optical disk 1 at all times.

The sum of the output signals of tracking position sensors 8 when focusing and tracking reflects the configuration of pits (recorded data) on track. This signal is supplied to video circuit 19, in which image data is reproduced.

Laser controller 14, focusing controller 15, tracking controller 16, linear motor controller 17, motor controller 18 and video circuit 19 are controlled from CPU 23 through bus line 20.

CPU 23 performs predetermined operations according to programs stored in memory 24. A/D and D/A converters 21 and 22 are used for transfer of data between focusing controller 15, tracking controller 16 and linear motor 17 on one hand and CPU 23 on the other hand.

FIG. 2 shows the detailed circuit construction of laser controller 14 shown in FIG. 2. Recording signal R1 supplied through CPU 23 is supplied to the base of transistor 31. Transistor 31 has its emitter grounded through resistor 32 and its collector connected to the collector of transistors 33 and 34 an also connected to the cathode of semiconductor laser 9. The anode of semiconductor laser 9 is connected to a power source VLD and also connected to the cathode of light-receiving element PD.

The anode of light-receiving element PD is connected through reproduction controller 35 to the base of transistor 34, the emitter of which is grounded through resistor 36.

The emitter of transistor 33 is grounded through resistor 37. The base of transistor 34 is connected to a movable contact 38a of switch circuit 38 controlled by CPU 23. Switch 38 has fixed contact 38b which is grounded and fixed contact 38c which is connected through resistor 39 to power source VLD.

The operation of this structure will now be described.

When the power source is connected to the data reproducing apparatus, movable contact 38a of switch circuit 38 is first connected to fixed contact 38c under control of CPU 23, thus turning on transistor 33. As a result, an idling current is generated through semiconductor laser 9 to such an extent that semiconductor laser 9 does not emit light. After the connection of the power source to the data reproducing apparatus, time is usually necessary for an initial stage operation of optical disk 1 and initial setting of the apparatus. This time is used to cause the idling current through semiconductor laser 9, thus stabilizing the light output.

When subsequently recording data on optical disk 1, transistor 31 is turned on by recording signal RI supplied form CPU 23, and according to this recording signal RI semiconductor laser 9 is driven to generate a laser beam to effect the recording of data on optical disk 1.

When reproducing data recorded on optical disk 1, transistor 34 is turned on by reproduction controller 35, whereby the semiconductor laser is driven by the reproduction output for laser beam generation. The laser beam generated from semiconductor laser 9 illuminates optical disk 1 for reproduction of recorded data, while it is also detected by light-receiving element PD. Reproduction controller 35 operates transistor 34 according to the detection output of light-receiving element PD such as to make constant the dose of laser beam from the semiconductor laser. When reproducing data recorded on the optical disk, movable contact 38a of switch circuit 38 may be connected to fixed contact 38b to cut off the idling current.

In the above embodiment, when connecting the power source of the apparatus, an idling current is supplied to semiconductor laser 9 to stabilize the laser beam output of semiconductor laser 9. Thus, when recording and reproducing data a required dose of laser beam can be obtained to ensure reliable recording and reproduction of data. In the above embodiment, at the time of the close of the power source an idling current is supplied to semiconductor laser 9. However, this is by no means limitative, and it is possible to arrange such that when neither recording nor reproduction of data is done for a predetermined period of time an idling current is supplied again to semiconductor laser 9 under control of CPU 23.

Further, while switch circuit 38 is controlled by CPU 23, this is by no means limitative.

What is claimed is:

1. A laser current control system in an optical reproducing memory system, comprising:
    an optical memory device in which data is recorded;
    means for generating a light beam to effect reproducing of the data recorded in said optical memory device;
    optical means for focusing the light beam onto said optical memory device while reproducing said data recorded in said optical memory device; and
    means for supplying a current to said generating means, said supplying means including first means for supplying an idling current insufficient to generate a light beam, and second means for supplying an operation current sufficient to generate a light beam.

2. An optical system according to claim 1, wherein said first means includes switch means and a transistor connected in series with said generating means, for controlling the supply of said idling current.

3. An optical system according to claim 1, wherein said means for generating a light beam is a semiconductor laser.

4. A laser current control system in an optical reproducing memory system, comprising:
    an optical memory device;
    means for generating a light beam to record data in said optical memory device and to reproduce data from said optical memory device;
    means for supplying a current to said generating means, said supplying means including first means for supplying an idling current insufficient to generate a light beam;
    optical means for focusing the light beam generated by said generating means onto said optical memory device while recording data in said optical memory device;
    first transistor means for controlling the idling current supplied from said first supplying means in order that the idling current not become sufficiently large to enable generating means to generate a light beam;
    second means for supplying an operation current sufficient to generate a light beam;
    second transistor means for controlling the current supplied from said second supplying means to enable said generating means to generate a light beam which is sufficient to reproduce data from said optical memory device; and
    third transistor means for controlling the current supplied from said second supplying means to enable said light beam generating means to generate a light beam which is sufficient to record data onto said optical memory device.

* * * * *

UNITED STATES PATENT AND TRADEMARK OFFICE
CERTIFICATE OF CORRECTION

PATENT NO. : 4,918,681
DATED : April 17, 1990
INVENTOR(S) : Hidetoshi Ikeda

It is certified that error appears in the above-identified patent and that said Letters Patent is hereby corrected as shown below:

On the title page, item [30] Foreign Application Priority Data:

please delete the Application Number
"51-311515" and insert --61-311515--;

In the Claims

Claim 4, Column 4, Line 43, insert --said-- after enable.

Signed and Sealed this

Ninth Day of June, 1992

Attest:

DOUGLAS B. COMER

*Attesting Officer*  Acting Commissioner of Patents and Trademarks